(12) United States Patent
Marinissen et al.

(10) Patent No.: US 9,041,411 B2
(45) Date of Patent: May 26, 2015

(54) TESTING OF AN INTEGRATED CIRCUIT THAT CONTAINS SECRET INFORMATION

(75) Inventors: Erik J. Marinissen, Leuven (BE); Sandeep Kumar Goel, Eindhoven (NL); Andre K. Nieuwland, Waalre (NL); Hubertus G. H. Vermuelen, Eindhoven (NL); Hendrikus P. E. Vranken, Weert (NL)

(73) Assignee: NXP B.V., Eindhoven (NL)

( * ) Notice: Subject to any disclaimer, the term of this patent is extended or adjusted under 35 U.S.C. 154(b) by 1744 days.

(21) Appl. No.: 12/063,151

(22) PCT Filed: Aug. 9, 2006

(86) PCT No.: PCT/IB2006/052746
§ 371 (c)(1),
(2), (4) Date: Jun. 24, 2010

(87) PCT Pub. No.: WO2007/017838
PCT Pub. Date: Feb. 15, 2007

(65) Prior Publication Data
US 2010/0264932 A1    Oct. 21, 2010

(30) Foreign Application Priority Data
Aug. 10, 2005   (EP) ..................... 05107361

(51) Int. Cl.
*G01R 31/02*   (2006.01)
*G01R 31/317*   (2006.01)
*G01R 31/3185*   (2006.01)

(52) U.S. Cl.
CPC .. *G01R 31/31719* (2013.01); *G01R 31/318533* (2013.01)

(58) Field of Classification Search
None
See application file for complete search history.

(56) References Cited

U.S. PATENT DOCUMENTS 5,101,121 A   3/1992   Sourgen
5,264,742 A   11/1993   Sourgen
(Continued)

FOREIGN PATENT DOCUMENTS

WO   WO 2007017838 A1 *   2/2007

OTHER PUBLICATIONS

Hafner, K. et al. "Design and Test of an Integrated Cryptochip", IEEE Design and Test of Computers, vol. 8, No. 4, pp. 6-17 (Dec. 1991).
(Continued)

*Primary Examiner* — Paresh Patel (57) ABSTRACT

An integrated circuit (10) comprises a functional circuit (12*a*-*c*) that contain information that must be secured against unauthorized access. The integrated circuit comprises a test access circuit (14, 16) coupled to the functional circuit (12*a*-*c*), and a plurality of fuse elements (18) coupled to the test access circuit (14, 16). The fuse elements (18) are connected in a circuit configuration that makes the functional circuit (12*a*-*c*) consistently accessible via the test access circuit (14, 16) only when first fuse elements (18) of the plurality are in a blown state and second fuse elements (18) of the plurality are in a not-blown state. As a result the integrated circuit can be tested after selectively blowing all of the first fuse elements (18). After testing at least part of the second fuse elements (18) is blown. As a result, a person that does not know which fuse elements are first fuse elements and which are second fuse elements is presented with difficulties to restore the integrated circuit to a state where test access with the danger of access to the secured information is possible.

13 Claims, 10 Drawing Sheets

(56) References Cited

U.S. PATENT DOCUMENTS

| | | | |
|---|---|---|---|
| 5,357,572 | A | 10/1994 | Bianco et al. |
| 5,787,091 | A * | 7/1998 | Kersh, III .................. 714/711 |
| 5,898,776 | A | 4/1999 | Apland et al. |
| 6,754,606 | B2 | 6/2004 | Mueller |
| 6,948,098 | B2 * | 9/2005 | Pillay et al. .................. 714/34 |
| 7,844,831 | B2 * | 11/2010 | Benhammou et al. ........ 713/189 |
| 8,281,223 | B2 * | 10/2012 | Gaskins et al. ............... 714/764 |
| 2001/0025355 | A1 | 9/2001 | Palm et al. |
| 2002/0069386 | A1 | 6/2002 | Neeb |
| 2010/0223515 | A1 | 9/2010 | Nieuwland et al. |

OTHER PUBLICATIONS

Curiger, A. et al. "VINCI: VLSI Implementation of the New Secret-Key Block Cipher IDEA", Proceedings of IEEE 1993 Custom Integrated Circuits Conference, pp. 15.5.1-15.5.4 (1993).

Bonnenberg, H. et al. "VINCI: Secure Test of a VLSI High-Speed Encryption Systems", IEEE Proceedings International Test Conference, pp. 782-790 (1993).

Bonnenberg, H. et al. "A New and Secure Selftest Scheme for Block Cipher Implementations", IEEE Proceedings of ETC 96, Third European Test Conference, pp. 501-502 (1993).

Hely, D. et al. "Scan Design and Secure Chip", Proceedings $10^{th}$ IEEE International On-Line Testing Symposium, pp. 219-224 (2004).

Yang, B. et al. "Scan Based Side Channel Attack on Dedicated Hardware Implementations of Data Encryption Standard", Proceedings International Test Conference, pp. 339-344 (2004).

Anderson, R. et al. "Tamper Resistance—a Cautionary Note", Proceedings of the Second USENIX Workshop on Electronic Commerce Oakland, CA, pp. 1-11 (Nov. 1996).

Kommerling, O. et al. "Design Principles for Tamper-Resistant Smartcard Processors", Proceedings of the USENIX Workshop on Smartcard Technology, Chicago, U.S., pp. 9-20 (1999).

Kocher, P. et al. "Security as a New Dimension in Embedded System Design", Proceedings of the $41^{st}$ Design Automation Conference, pp. 753-760 (Jun. 2004).

* cited by examiner

TESTING OF AN INTEGRATED CIRCUIT THAT CONTAINS SECRET INFORMATION

The invention relates to testing of integrated circuits, and in particular of integrated circuits that contain secret information that must be protected against unauthorized access.

Testability and secrecy impose conflicting design requirements on integrated circuits. Testability requires that each circuit element should be coupled to a scan chain in such a way that expected faults in the circuit element show up in response signals from the circuit element that are captured into the scan chain in response to test stimuli from the scan chain. Thus the integrated circuit can easily be tested by using the scan chain to apply test stimuli and shift out test responses. Unfortunately, this also means that signals affected by secret information in the circuit elements can easily be accessed through the scan chain.

On the other hand secrecy can be achieved with a construction of the circuit wherein circuit parts with secret information do not affect the captured responses in the scan chain in any way. This limits the possibility to test these circuits to observation of functional responses of the entire circuit under normal functional conditions. In this way it is not possible to give a guarantee that the circuit will operate properly under all circumstances, or only after protracted and therefore expensive testing.

U.S. Pat. No. 6,754,606 describes an integrated circuit with a scan chain and fuses for preventing readout of data from the scan chain. The fuses may be located in a test control circuit, for example, to prevent switching to a test mode of operation once a fuse has been blown. The fuses may also be located at a plurality of locations in the shift path of the scan chain, so that blowing the fuses access to the scan chain is made impossible.

Conventionally, a fuse is a circuit that provides a conductive connection before the fuse is blown and an open circuit afterward. Alternatively anti-fuses may be used, i.e. circuits that provide an open circuit before being blown and a conductive connection afterwards. The term "fuse element" is used in this document to denote either a fuse or an anti-fuse and any other element that can be made to change state by blowing the fuse element, including for example (dis-)charging of floating gate structures adjacent to a current channel. The term "blowing" of a fuse element is used to refer to any change of state that affects subsequent state of the fuse element.

The integrated circuit of U.S. Pat. No. 6,754,606 is vulnerable to attack by repair of fuses or anti-fuses. With certain advanced equipment it is possible to restore blown fuses and anti-fuses to their original state, i.e. to repair the fuse elements. That is, "blowing" becomes a reversible action, so that fuse elements can be in a non-blown state (their original state or a state achieved by restoring) or in a blown state (after blowing when the fuse element is in the non-blown state. Thus, by restoring all the fuses elements to the non-blown state with such advanced equipment, the circuit can be returned to a state wherein the secret data can be read out through the scan chain.

Among others, it is an object of the invention to make an integrated circuit that prevents access to secret information via the scan chain by means of fuse elements less vulnerable to access after repair of the fuse elements.

A method of testing an integrated circuit according to claim 1 is provided. This method involves testing preceded by blowing first fuse elements, testing and subsequently blowing second fuse elements. The integrated circuit is arranged to permit consistent access to a test access circuit only when all the first fuse elements are in a blown state and all the second fuse elements are in a non-blown state. To test again, only the second fuse elements should be repaired. Also repairing any one of the first fuse elements leaves testing impossible. But because these second fuse elements cannot easily be distinguished from the first fuse elements it is not possible to know which fuse elements need to be repaired and which not. Preferably the number of first fuse elements plus the number of second fuse elements is large, e.g. 16 or greater and preferably 64 or greater, so that a considerable trial and error time would be involved to identify the fuse elements that need to be restored.

In an embodiment to support the method an integrated circuit is provided with first and second fuse elements and a test access circuit that is consistently accessible only when first fuse elements are in a blown state and second fuses elements are in a not-blown state. In a further embodiment different functional circuits are made test-accessible, while making others to inaccessible by blowing increasingly larger subsets of fuse elements. In a further embodiment the integrated circuit combines information about the state of all fuse elements into a single signal that controls consistent access to a scan chain. In another embodiment different non-empty groups of the fuse elements control different parts of a scan chain so that the scan chain operates in a normal way only if the required combination of blowing and not-blowing is used. Thus, the scan chain cannot be made to work by attacking a single point of the integrated circuit.

In one embodiment consistent access to the scan chain is made impossible simply by blocking access (shift in and/or shift out altogether). In another embodiment the scan chain remains active even when not the exact appropriate combination of fuse elements is blown, the other fuse elements not being blown, but the number of times that test data passes through a scan cell in the scan chain is changed in time during shifting of test data if not the exact appropriate combination of fuse elements is blown. Changes in this number of times are made in response to test shift clocking without requiring external commands to make the changes. Thus, consistent access is made impossible. The number of times that test data passes through a scan cell can be changed for example by looping back test data through the scan cell, bypassing the scan cell or swapping test data between different scan chains that are coupled between different pairs of external terminals.

These and other objects and advantageous aspects of the invention will become apparent from the description of non-limitative embodiments using the following figures.

FIG. 1 shows an integrated circuit 10 comprising functional circuits 12a-c, a scan chain 14, a test control circuit 16 and fuse elements 18. Test control circuit 16 has inputs coupled to an external test interface 17 and control outputs (connections not shown) coupled to scan chain 14. Scan chain 14 has an input coupled to a test data input of external test interface 17 and an output coupled to a test data output of external test interface 17. Fuse elements 18 are coupled to test control circuit 16 and scan-chain 14. Scan chain 14 is coupled to inputs and outputs of functional logic functional circuits 12a-c. Although single input and output lines are shown between functional circuits 12a-c and scan chain 14, it should be appreciated that in practice many such lines may be provided in parallel.

Figure 1:
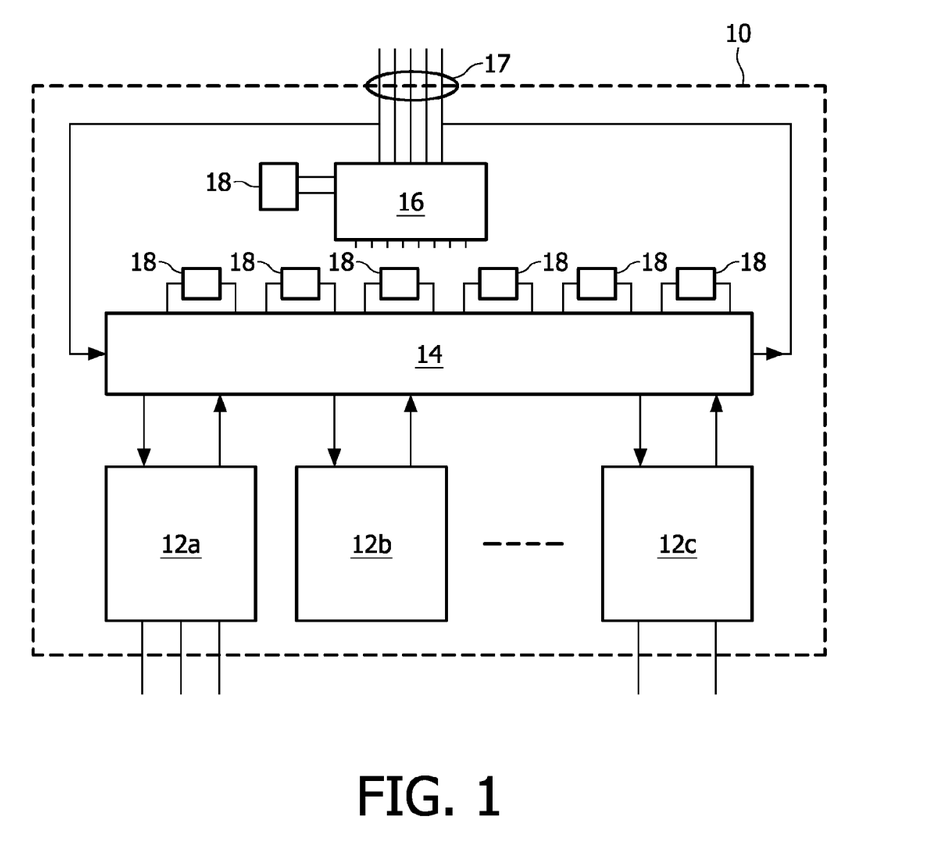
FIG. 1 shows an integrated circuit with fuses to protect access to circuits via a scan chain

It should be emphasized that the figure has been limited to aspects of the integrated circuit that serve to explain the use of fuse elements 18. An arbitrary number of functional circuits 12a-c has been shown, with arbitrary external connections. In practice many additional test-features may be present, such as a boundary scan chain coupled between the integrated circuit-external inputs and outputs of functional circuits 12a-c, a plurality of parallel scan chains coupled between the same test data input and output, shared use of terminals of integrated circuit 10 for input/output of functional circuit and test interface 17, etc.

At least one of functional circuits 12a-c contains "secret" information, i.e. information that should not leave integrated circuit 10. Typically this to information is a cryptographic key or an identity code, which may be stored in a non-volatile memory in the relevant functional circuit 12a-c, or otherwise programmed in this functional circuit 12a-c, or defined by circuits that have been implemented in the functional circuit 12a-c. Typically, each manufactured integrated circuit has its own unique secret information, but alternatively the secret information may be the same for every integrated circuit of a class.

In operation, the circuit can be switched between a normal functional mode and a test mode. In the normal functional mode flip-flops from scan chain 14 serve as flip-flops that are coupled between inputs and outputs of functional circuits 12a-c. In the test mode the inputs of flip-flops in the scan chain are coupled to the outputs of other flip-flops in the scan chain, so that a serial shift register is formed.

When a number of the fuse elements 18 has been blown, the integrated circuit can be tested by a conventional scan test protocol in the test mode. In one example of such a protocol the circuit first enters a shift mode of operation wherein the flip-flops of the scan chain are coupled in series and test stimuli from the test data input are serially shifted through scan chain 14, from where they are applied to inputs of functional circuits 12a-c. Subsequently the circuit enters a capture mode wherein the inputs of flip-flops of the scan chain 14 are coupled to the outputs of functional circuits 12a-c so that these flip-flops capture test responses from functional circuits 12a-c. After this the circuit returns to a shift mode wherein the flip-flops of scan chain 14 once more form a shift register and scan chain 14 shifts captured data to the test data output out of integrated circuit 10.

Different ones of the fuse elements 18 serve to enable and disable conventional test operation respectively when not blown. Fuse elements 18 may be connected to test control circuit 16 to enable or disable switching between the different modes of operation during testing. In one example, fuse elements 18 are arranged to disable switching to the capture mode. In another example may be fuse elements 18 are arranged to disable or enable supply of a test clock to circuits from scan chain 14 and/or to test control circuit 16. Fuse to elements 18 may coupled to scan chain 14 to enable or disable normal shifting, e.g. by blocking or establishing a shift path through scan chain 14, or by bypassing part of scan chain 14.

Fuse elements can be fuses and/or anti-fuses. A fuse/anti-fuse, as used herein, is an electrical connection that can be made to a assume a state that provides a conductive/non-conductive (blown) connection in such a way that physical repair, such as deposition of conductive material, is needed to restore the situation before blowing. Blowing may be achieved for example by applying a high voltage across the fuse/anti-fuse or by heating the fuse/anti-fuse, for example with a laser beam or electrically.

Figure 2:
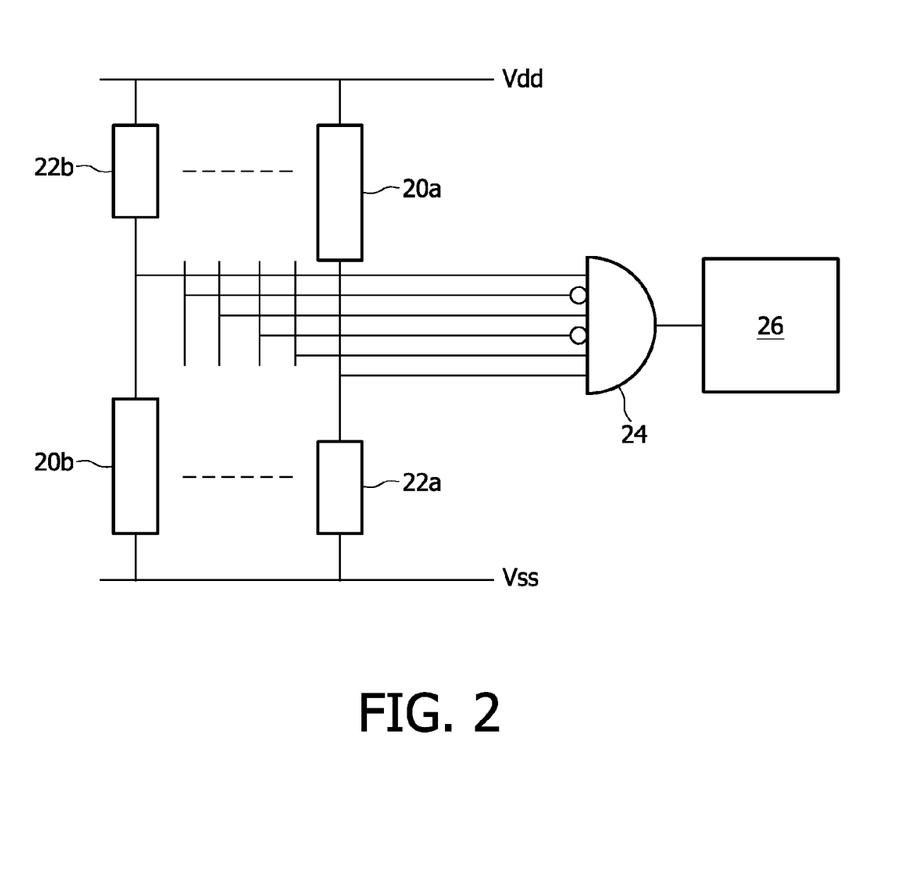
FIG. 2 shows control of a scan function by means of a plurality of fuses

FIG. 2 shows a circuit with a plurality of fuses 20a-b. The circuit comprises a plurality of series arrangements of a fuse 20a-b and a resistive element 22a-b coupled between power supply connections Vdd, Vss. Although only two series arrangements are shown, it should be realized that any number may be present. The circuit comprises an AND gate 24 with inputs coupled to nodes in respective ones of the series arrangements between the fuse 20a-b and the resistive element 22a-b. Some of the inputs of AND gate 24 are inverting and others are non-inverting. AND gate 24 has an output coupled to an enable/disable control input of a test circuit 26. Test circuit 26 is constructed so that it disables normal test operation when it receives a logic low enable/disable control signal and that it enables normal test operation when it receives a logic high enable/disable control signal. Test circuit 26 may be a circuit that enables switching to the capture mode, supplying of test clock signals, passing of test data through a connection scan chain 14, etc.

In part of the series arrangements, the fuse 20a-b of the series arrangement couples the node to one of the power supply connections Vdd, Vss. In the remaining series connections the fuse 20a-b couples the node to the other one of the power supply connections Vdd, Vss. Hence normal test operation is enabled only if fuses 20a-b with connections of a first type are not intact and fuses with connections of a second type are intact. Herein the fuses 20a-b with connections of the first type are fuses 20a-b that are connected to to the higher power supply connection Vdd and a non-inverting input of AND gate 24 and fuses 20a-b that are connected to the lower power supply connection Vss and an inverting input of AND gate 24. Conversely fuses 20a-b with connections of the second type are fuses 20a-b that are connected to the lower power supply connection Vss and a non-inverting input of AND gate 24 and fuses 20a-b that are connected to the higher power supply connection Vdd and an inverting input of AND gate 24.

Instead of part or all of fuses 20a-b anti-fuses may be used. Fuses and anti-fuses will commonly be referred to as fuse elements. Fuse elements are anti-fuses can similarly be distinguished into a first and second type, according to whether they must be blown before testing or not. Anti-fuses 20a-b with connections of the first type are anti-fuses 20a-b that are connected to the higher power supply connection Vdd and an inverting input of AND gate 24 and anti-fuses 20a-b that are connected to the lower power supply connection Vss and a non-inverting input of AND gate 24. Conversely anti-fuses 20a-b with connections of the second type are anti-fuses 20a-b that are connected to the lower power supply connection Vss and an inverting input of AND gate 24 and anti-fuses 20a-b that are connected to the higher power supply connection Vdd and a non-inverting input of AND gate 24.

After manufacture of integrated circuit 10 all fuse elements 20a-b are intact. Before testing fuse elements 20a-b with connections of the second type are blown, but the fuse elements with connections of the first type are not blown. The integrated circuit is then ready for testing. After testing at least part of the fuse elements 20a-b with connections of the first type are blown as well.

As a result, a person that does not know whether a fuse element has a connection of the first type or second type is not able to predict which of the blown fuse elements should be repaired and which not, in order to re-enable testing. As will be appreciated determination of the type of fuse element is made more difficult by connecting the fuse elements so that the voltages at their terminals do not provide any information about the type of fuse element. In the example of the figure, this is realized by using inverting and non-inverting inputs of the AND gate for fuse elements that produce a high logic level input signal when blown and/or by using inverting and non-inverting inputs of the AND gate for fuse elements that produce a low logic level input signal when blown. A inverting input may be realized by including an chain of an odd number of inverting circuits between a fuse element and an input of the AND gate (or other multi-input logic circuit). A non-inverting input may be realized by including an chain of an even number of inverting circuits or no inverting circuits between a fuse element and an input of the AND gate (or other multi-input logic circuit). By using an even number greater than zero it is made more difficult to distinguish fuses of the first and second type.

As will be appreciated determination of the type of connection can be made difficult for example by placing a part of the integrated circuit that contains AND gate 24 and its inverting/non-inverting inputs under a covering layer that can not easily be removed without destroying the circuit, by distributing the AND gate over different areas of the integrated circuit, etc.

As will be appreciated AND gate 24 with inverting and non-inverting inputs is only one example of a circuit with this effect. Any other circuit may be used that enables testing only when one predetermined combination or one of a few combinations of fuses 20a-b is intact and others are not intact. Also, of course instead of at least part of fuses 20a-b may be connected so that they do not affect testing. This also makes it more difficult to identify the fuses that must be restored.

It is not necessary to use a circuit that combines the effect of the fuses into one signal, as is the case in FIG. 2. Alternatively, circuits may be used wherein different fuses have effects at different places in the test circuit, but so that their combined effect allows sensible testing only if the appropriate combination of fuses has been blown/not blown. This has the advantage that the circuit is less vulnerable to local tampering. To prevent repair, testing should be allowed only in a configuration wherein the fuses that affect the scan chain at predetermined first places have been blown and fuses that affect the scan chain at predetermined second places have not been blown. Instead of to an individual fuse for each place along the scan chain, groups of fuses may be used. A circuit like that of FIG. 2 may be used to realize this for example.

Figure 2A:
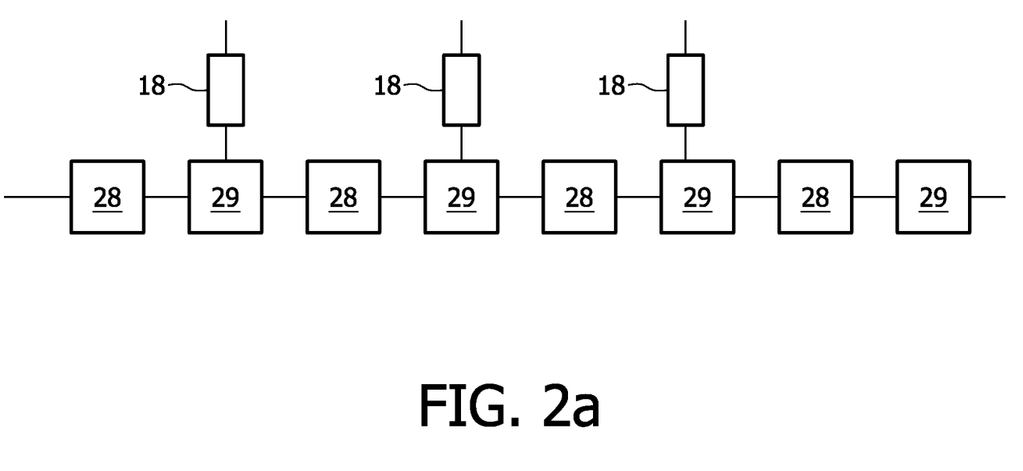
FIG. 2a shows a scan chain

FIG. 2a shows an example wherein a scan chain, with scan flip-flops 28 contains modifying circuits 29 coupled to respective fuse elements 18. In this circuit each modifying circuit 29 is arranged to affect test data that flows through the scan chain in a first way if its corresponding fuse/anti-fuse 18 is not blown and in a second way if the corresponding fuse/anti-fuse 18 is blown. The combination of modifying circuits 29 is selected so that their combined effect results no modification if only a selected combination of fuses is blown.

Modifying circuits 29 may for example forward unmodified data if the fuse/anti-fuse 18 is blown and exclusive OR results of successive test data bits with a time dependent pseudo-random sequence if the fuse/anti-fuse 18 is not blown. In this case, the pseudo-random sequences of a different modifying circuit 29 may be time shifted versions of each other by amount corresponding to their distance in the scan chain, so that their combined effect is to leave data unmodified after it has been shifted through both modifying circuits 29. In a more complicated embodiment different pseudo random sequences may be used for different modifying circuits 29, selected so that their time shifted exclusive OR is always zero. Thus, their combined effect is to leave data unmodified after it has been shifted through both modifying circuits 29. In another embodiment different flip-flops may be used in parallel at different stages of the scan chain, so that along part of the scan chain parallel branches are available. In this embodiment modifying circuits 29 switch data between different branches, so that the data propagates beyond the parallel branches only if the appropriate combination of switches is made.

Figure 2B:
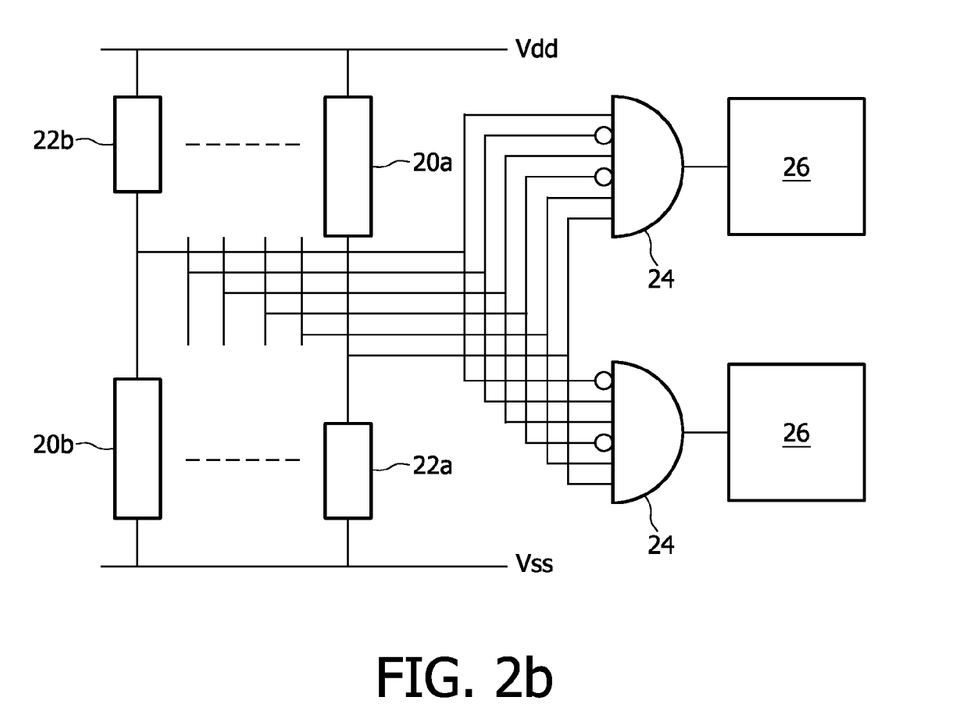
FIG. 2b shows control of a scan function by means of a plurality of fuses

FIG. 2b shows an example of a circuit that can be used to enable operation in different states. A plurality of AND gates 24 is provided, each for enabling operation in a different state, wherein the AND gate enables a scan chain (not shown) to access a different set of one or more functional circuits (not shown) that contain secret information. As can be seen, the AND gates at least partly receive signals from the same (anti-) fuses. Preferably, the connections to the AND gates are arranged so that first a selection of (anti-) fuses must be blown to create an enabling signal from a first AND gate and subsequently additional (anti-) fuses must be blown that create an enabling signal from a second AND gate, thereby at the same time disabling the first AND gate.

Thus, there are three classes of (anti-) fuses. The first AND gate is connected to all three classes so that it outputs a logic one if only the (anti-) fuses of the first class are blown, the second AND gate is connected to all three classes so that it outputs a logic one if only the (anti-) fuses of the class first and second class are blown. It should be appreciated that more than two AND gates may be used in this way, defining increasingly large sets of anti-fuses that must be blown.

As has been noted for FIG. 2, the AND gates and the particular connections are shown merely for illustrative purposes. Other circuits with the same effect on test access may be used. Furthermore, although signals from all (anti-) fuses are coupled to both AND gates 24, it should be appreciated that this is not necessary.

Although embodiments have been shown wherein test access to circuits with secret information is enabled and disabled as a whole, it should be appreciated that this is not necessary. Instead, the integrated circuit may provide for a plurality of different states, in each of which test access is possible only to a respective part of the secret information (the respective parts for different states being different, although overlaps are not excluded). In this case the integrated circuit is preferably set to successive ones of these states during testing, each time by blowing an additional number of fuses or anti-fuses. Preferably, the same (anti-) fuses are used to enable operation in different states.

Figure 3:
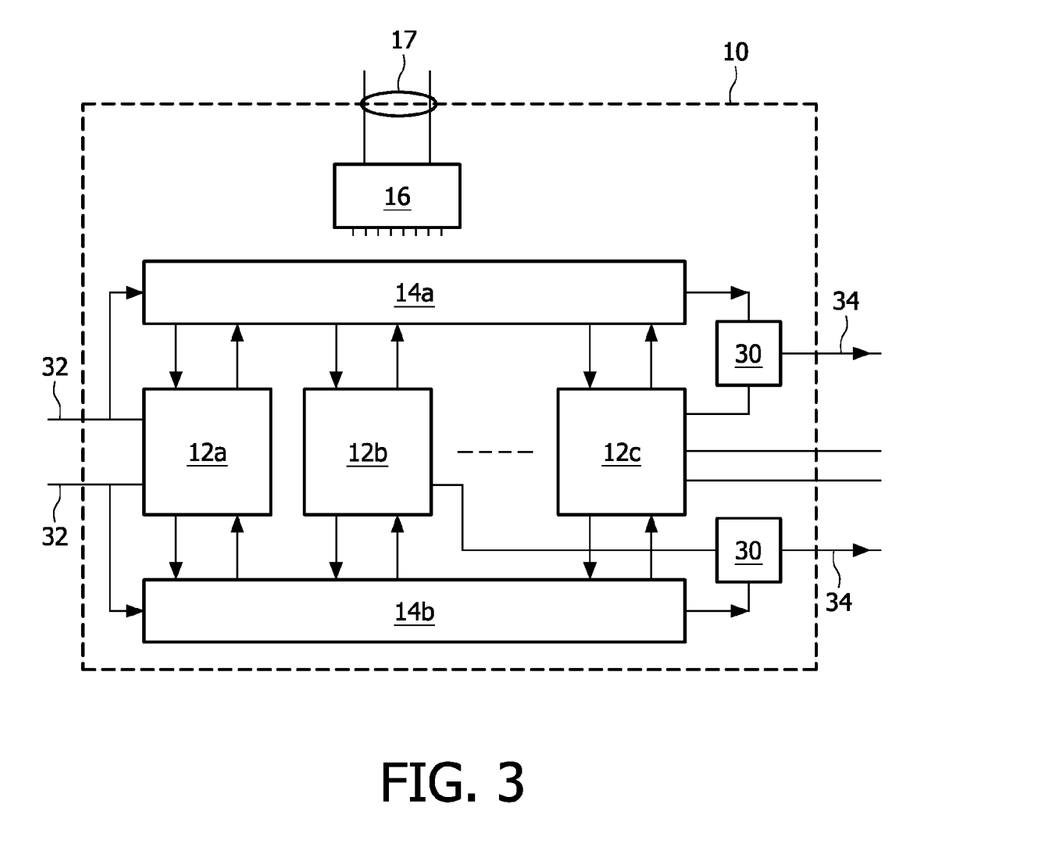
FIG. 3 shows a circuit wherein test terminals are multiplexed with functional terminals

FIG. 3 shows an integrated circuit that has external connections 32, 34 that are multiplexed as test data inputs/outputs and as input/outputs of functional circuits 12a-b. Multiplexers 30 are provided at the multiplexed outputs of integrated circuit 10. Each multiplexer 30 has a first input coupled to an output of a functional circuit 12a-c and a second input coupled to an output of a scan chain 14a,b. An output of the multiplexer 30 is coupled to an external to terminal 34 of integrated circuit 10. A control input (not shown) of the multiplexer 30 is coupled to test control circuit 16. A number of input terminals is coupled in parallel to an input of a functional circuit 12a-c and an input of a scan chain. In addition, terminals 32 may be used that can be switched to function alternately as input and output. It should be understood that the multiplexed inputs 32 and outputs 34 are shown only by way of example. In practice a far greater number of terminals may be present, some or all of which may be multiplexed as test inputs and outputs.

A plurality of scan chains 14a-b is shown. For the sake of completeness each functional circuit 12a-b is shown coupled to all scan chains 14a-b, although of course preferably each functional circuit 12a-b has inputs and outputs coupled to one of the scan chains only.

Preferably, the integrated circuit is construed to make it difficult to determine to which of the external terminals of integrated circuit the inputs and/or outputs of scan chains 14a-d are coupled. This is done by avoiding a one-to-one relation between test data that is shifted in at a test input and test data that is shifted out at a test output, at least when test is not authorized, for example because the correct sets of fuse elements (not shown) are not intact/blown respectively or when an appropriate key has been provided. Various circuits can be used to conceal the test data input/outputs.

Figure 4:
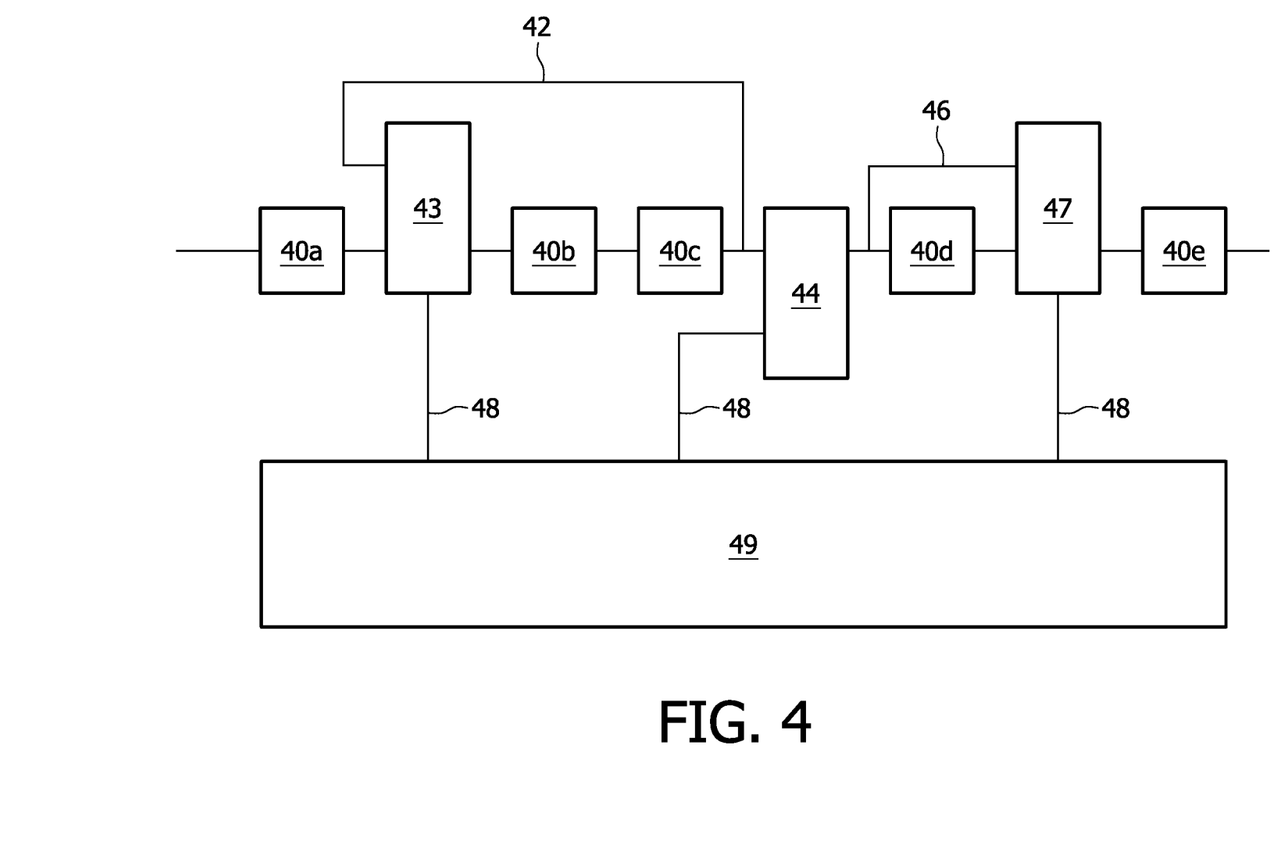
FIG. 4 shows a scan chain

FIG. 4 shows part of a scan chain with scan flip-flops 40a-e shown from left to right in a nominal sequence wherein test data is shifted through the scan chain. Only the connections that are used for shifting are shown. It should be understood for the scan chain of the present and following figures that all or most of the scan flip-flops 40a-e have an output coupled to an input of a functional circuit (not shown) and/or a functional input (not shown) coupled to an output of a functional circuit (not shown) as well as a control input (not shown) coupled to the test control circuit, to control whether data is loaded from the functional circuit or from a preceding scan flip-flop 40a-e in the scan chain.

A loop 42, a bypass 46 and a logic gate 44 have been added to the scan chain. A loop multiplexer 43 is provided with a first input coupled to the to output of a first scan flip-flop 40a of the scan chain and an output coupled to the input of a second scan flip-flop 40b that adjacent to the first scan flip-flop 40a in the nominal sequence of the scan chain. A second input of loop multiplexer 43 is coupled to an output of a third scan flip-flop 40c that follows the second scan flip-flop 40b in the nominal sequence. A bypass multiplexer 47 is provided with a first input coupled to the output of a fourth scan flip-flop 40d of the scan chain and an output coupled to the input of a fifth scan flip-flop 40e that adjacent to the fourth scan flip-flop 40d in the nominal sequence of the scan chain. A second input of loop multiplexer 43 is coupled to an output of a scan flip-flop 40c that precedes the fourth scan flip-flop 40d in the nominal sequence. An OR gate 44 is provided with a first input and an output coupled to the output and input to nominally successive flip-flops 40c-d in the scan chain respectively.

An authorization control circuit 49 has control lines 48 coupled to control inputs of loop multiplexer 43 and bypass multiplexer 47 and to a second input of OR gate 44.

In operation, authorization control circuit 49 detects whether test is not authorized, for example because the correct sets of fuse elements (not shown) are not intact/blown respectively, or when an appropriate key has been provided. When authorization control circuit 49 detects that the test is authorized authorization control circuit 49 applies steady signals to control lines 48, with a logic level so that loop multiplexer 43, OR gate 44 and bypass multiplexer 47 pass test data from scan flip-flops 40a-e for normal sequential shifting.

When authorization control circuit 49 detects that the test is not authorized authorization control circuit 49 applies time varying signals to the control lines (for example random or pseudo-random signals) to control lines 48. As a result loop multiplexer 43 will at times cause test data to be looped back, effectively lengthening the scan chain; bypass multiplexer 47 will at times cause the scan chain to shorten and OR gate 44 will at times overwrite test data with a logic one. In this way signal variations that are responsive to to test data pass through the scan chain, but there is no longer a one to one relationship between the stream of test data at the input and the output. While data is shifted through the scan chain outputs of functional circuits 12a-c that are connected to external terminals of the integrated circuit and that are responsive to the data in the scan chain remain connected to the external terminals, so that the shifting of data through the test chain causes signal variations at these external terminals. This makes it difficult to distinguish the external terminal of the integrated circuit that carries the output signal from the other external terminals, for example terminals that are coupled to outputs of functional circuits 12a-c which will also produce signal variations in response to the test data.

It should be appreciated that the configuration of a loop multiplexer 43, bypass multiplexer 47 and OR gate 44 and their connections are shown merely by way of example. In practice loops and bypasses involving a different number of scan flip-flops may be used, loops and/or bypasses may overlap. Logic gates may be used at any position in the scan chain, other types of logic gates such as AND gates or XOR (exclusive OR) gates may be used and more than one logic gate may be provided. Preferably a combination of loops, bypasses and logic gates is used, because this makes it harder to reconstruct the structure of the scan chain.

Figure 5:
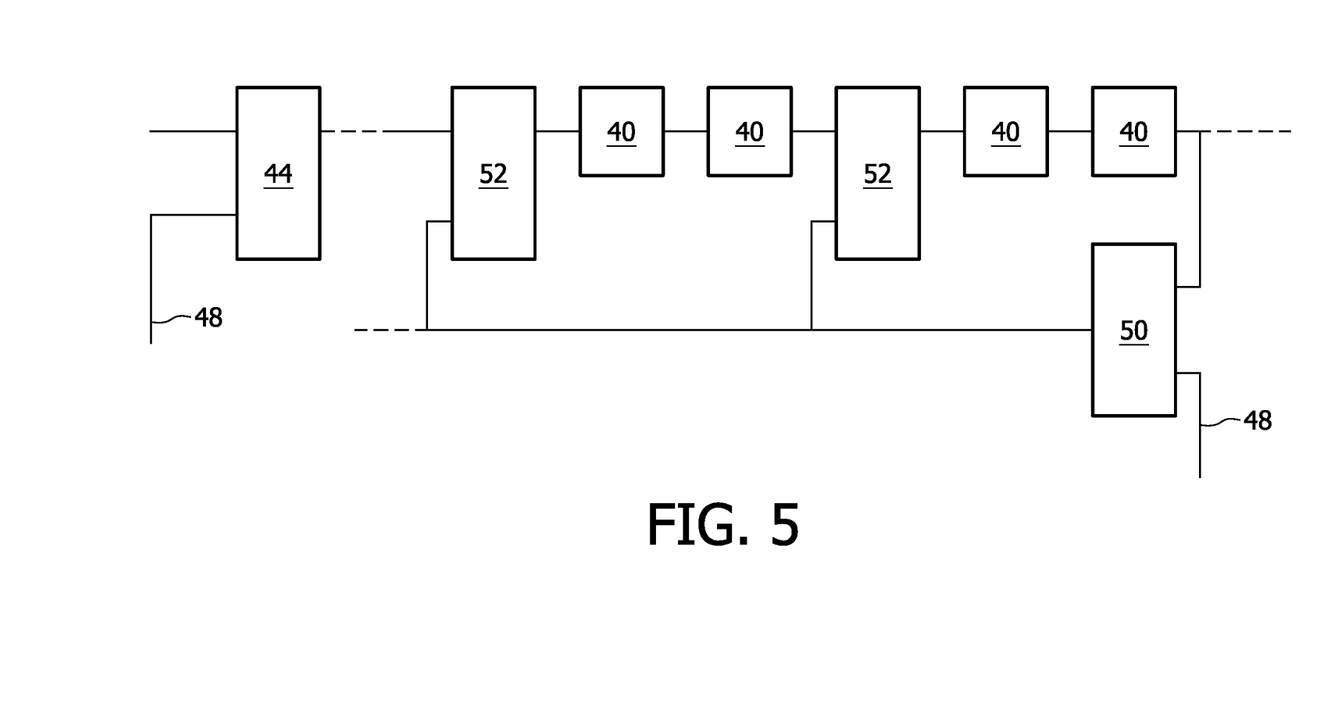
FIG. 5 shows a scan chain

FIG. 5 shows a part of a scan chain wherein a more complicated loop has been added. In this embodiment a Linear Feedback Shift Register (LFSR) is formed when the authorization control circuit (not shown) supplies an appropriate control signal. A plurality of XOR gates 52 has been provided in the scan chain before some of scan flip-flops 40. An AND gate 50 has been provided to feed back signals from a scan flip-flop 40 to inputs of the XOR gates if a corresponding control signal is received on control line 48 form the authorization control circuit (not shown). It should be appreciated that, only an example of an LFSR is shown, other LFSR with XOR's at more and/or different places along the scan chain may be used. Preferably an LFSR is used that is able to produce repeating sequences with a long repetition period in response to logic pulses at the feedback. Examples of connections for producing long to sequences are known from the LFSR art. It may also be noted that it suffices authorization control circuit (not shown) keeps the feedback switched on while no authorization is detected: it is not necessary to switch the feedback on and off. Preferably, the LFSR is preceded by a part of the scan chain that contains one or more logic gates, like OR gate 44 or a XOR gate, that are arranged to create logic signal variations in the data that is shifted through the scan chain, even if test data containing only logic zero's or only logic ones is supplied. In this case the LFSR will respond to the logic ones by generating more extensive pseudo-random patterns.

Figure 6:
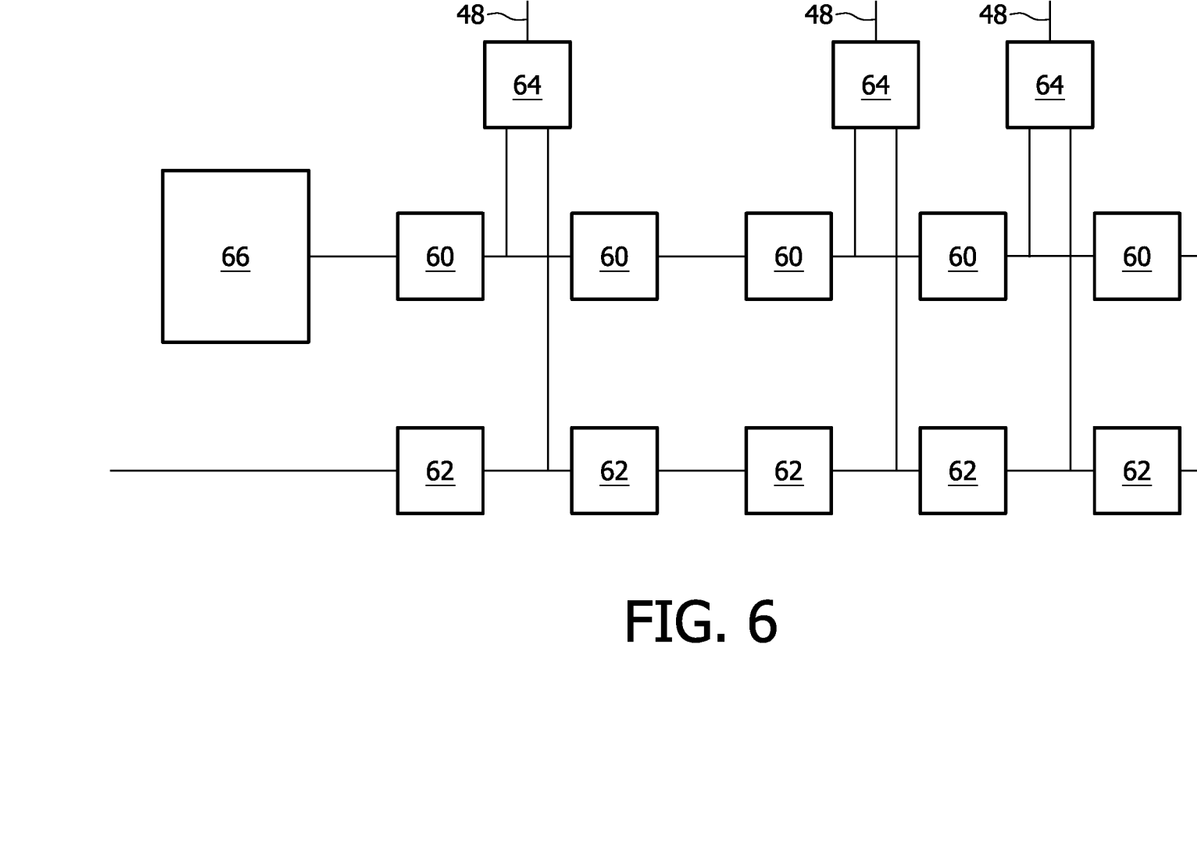
FIG. 6 shows an authorization control circuit

FIG. 6 shows part of an embodiment of an authorization control circuit. The authorization control circuit contains a key generator circuit 66, a first shift register with first flip-flops 60, a second shift register with second flip-flops 62 and XOR gates 64 (exclusive OR gates). Key generator circuit 66 has an output coupled to an input of the first shift register. The second shift register has an input coupled to an external terminal of the integrated circuit. XOR gates 64 each have inputs coupled to a respective pair of a first and second flip-flop 60, 62, and an output coupled to a control line 48. Control lines are coupled to scan chain for example as shown in FIG. 4. Although relatively short first and second shift registers are shown, it should be understood that much longer shift register may be used to which, and/or more XOR gates may be connected to generate additional control signals.

In operation, key generator circuit 66 (e.g. a pseudo random generator) outputs successive bits of a key to the first shift register. Bits from an external input are shifted through the second shift register. XOR gates 64 compare corresponding bits from the first and second shift register. If the bits from the first and second shift register match, XOR gates 64 supply signals to control lines 48 that make a scan chain operate normally, suppressing feedback, and/or bypass and/or overwriting of test data. If the bits from the first and second shift register don't match time dependent signals will arise on control line, which cause the scan chain to deviate from normal shift operation.

Preferably, the first and second shift register are clocked with the same clock as the scan chain (not shown) that is controlled by the authorization to control circuit. As one alternative, a divided down version of this clock may be used to clock the first and second shift register. By using the same or related clock signals the supply of matching new bits needs to continue during scan-shifting for testing. In this way very long running keys can be used, which makes it more difficult to get unauthorized access. In addition this automatically provides for time varying control signals for the scan chain, which make it difficult to identify the scan chain.

Although the use of only one shift register has been shown for shifting in the bits of the key, it should be understood that a plurality of shift registers may be used in parallel and/or that the control signals on control lines 48 may be generated as a result of comparing more than one bit of external key data and internal key data. The authorization control circuit may use a single key comparison to control a plurality of scan chains. Alternatively, a plurality of key comparisons may be used in parallel for different scan chains. As another alternative one key comparison circuit may be used to verify different keys for different scan chains.

As an alternative, conventional static key verification may be used in the authorization control circuit, or the first and second shift register may be prevented from shifting once a complete key has been loaded. In this case an external key is loaded into the authorization control circuit and the authorization control circuit detects whether this key is correct or not. When the authorization control circuit has found the key to be correct it sets the control signals on control lines 48 to make the scan chain function normally. If not the authorization control circuit feeds signals from a time dependent signal generator, such as a pseudo random generator or even a true random generator to control lines 48. This has the advantage that any key verification technique can be used, but it imposes a compromise between the length of the key and the overall time needed for testing.

Figure 6A:
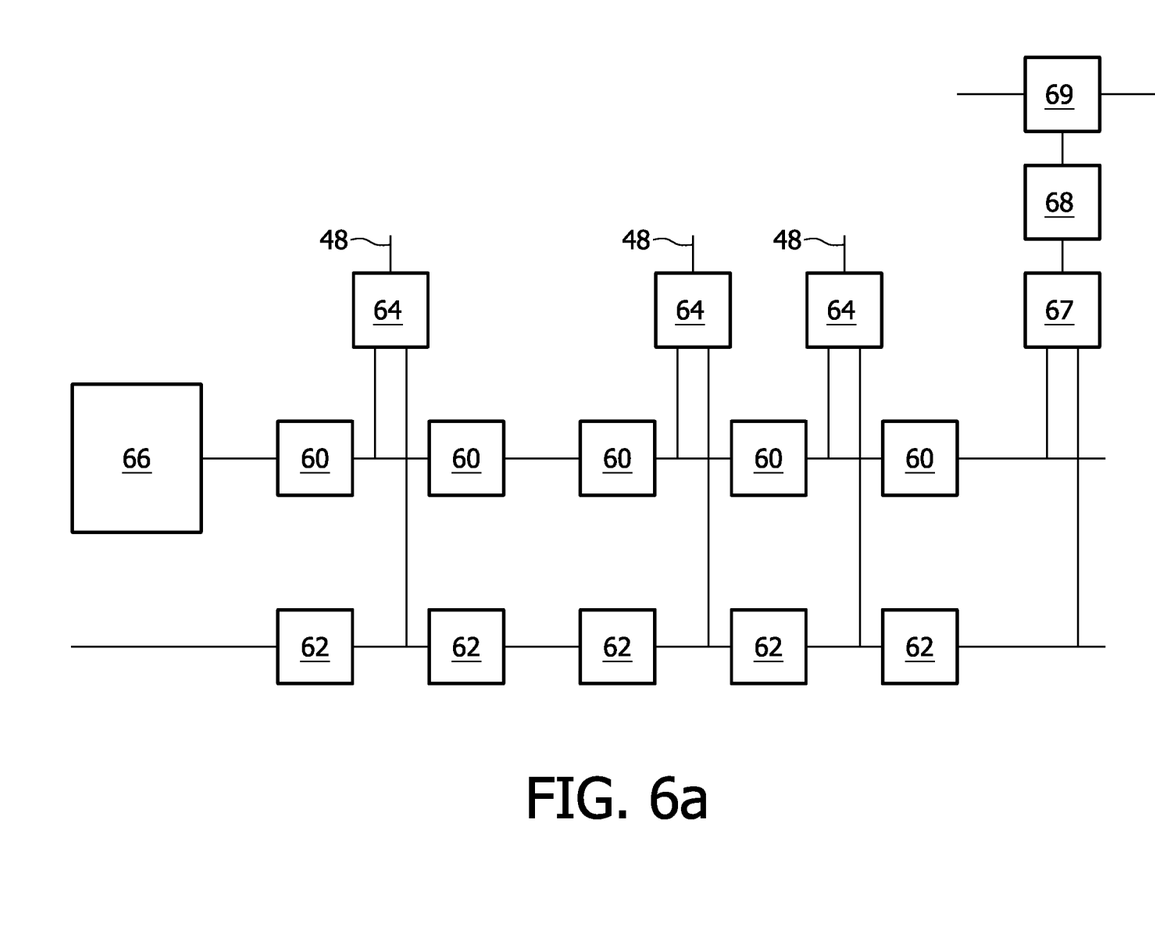
FIG. 6a shows a further application of an authorization control circuit

FIG. 6a shows an embodiment wherein the structure with the first and second shift register can also be used to enable or disable access to a scan chain. The first and second shift register for shifting in key data and a key reference respectively, clocked by same or related clock signals. In this to embodiment a comparison circuit 67 and a set/reset memory circuit 68 are provided. The comparison circuit 67 has inputs coupled to the first and second shift register and an output to a set input of the set/reset memory circuit 68. The set/reset memory 68 circuit is configured so that it is reset on power up, or at a reset of the integrated circuit. The set/reset memory circuit 68 is coupled to an enable/disable control input of an enable circuit 69 in the scan chain (not shown). In operation the set/reset memory circuit 68 disables input to and/or output from the scan chain once the set/reset memory circuit 68 is set. The set/reset memory circuit 68 is set by comparison circuit 67 when a mismatch occurs between the key data and the reference data in the first and second shift register Preferably the set/reset memory circuit 68 is clocked (not shown) so that a "set" occurs only when a stable comparison result is available.

Preferably key comparison continues indefinitely and at least until after capture of test responses. Preferably the key generator produces a reference sequence that does not repeat at least during a period that is needed to shift data through the scan chain.

It may be noted that the structure with enable circuit 69 can be applied even if no further comparator circuits 64 are used, i.e. when no other changes are made to the scan chain. This embodiment provides for a running comparison of keys that continues while test data is shifted through the scan chain. In this way time is gained because the start of testing does not need to wait for the end of comparison. Thus very long keys can be used without incurring a long delay. It may also be noted that the structure could be used to enable circuits other than enable circuits in a scan chain (even without enabling enable circuits in the scan chain). Thus, for example a secure function of an integrated circuit could be disabled after a mismatch between the key and the reference. This has the advantage that it prevents unauthorized use of the integrated circuit and/or unauthorized access. However, an advantage of using enabling circuit in the scan chain is that normal test access need not be limited to prevent access to secret information.

Figure 7:
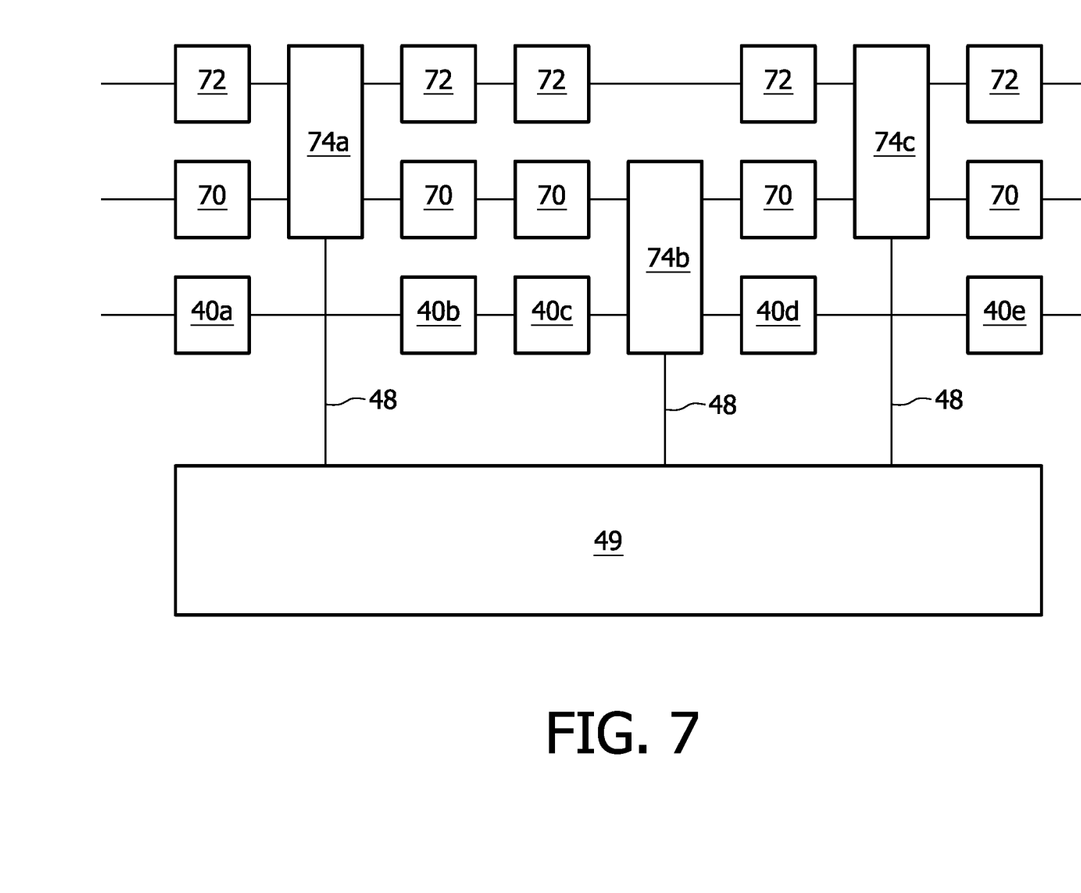
FIG. 7 shows a plurality of parallel scan chains

FIG. 7 shows a circuit with first, second and third scan chain, each with a set of scan flip-flops 40a-e, 70, 72 coupled as a shift register. Each scan to chain is coupled to a different pair of external terminals of the integrated circuit for supplying test data to the integrated circuit and receiving test results from the integrated circuit. Swapping circuits 74a-c are coupled between the scan flip-flops of pairs of scan chains. Swapping circuits 74a-c each have two inputs and two outputs and are arranged to feed input signals from a first and second input either to a first and second output respectively, or cross-wise to the second and first output respectively, under control of control signals from authorization control circuit 49. Each swapping circuits 74a-c may be realized as a pair of multiplexers, with mutually opposite control, but other circuits are possible.

In operation, when authorization control circuit 49 authorizes testing, it makes swapping circuits 74a-c pass test data along the scan chains in parallel. When authorization control circuit 49 authorizes testing, it applies time varying control signal to swapping circuits 74a-c (e.g. a pseudo random signal) so that at times test data crosses from one scan chain to another, thus obscuring the which of the outputs of the scan chains correspond to which inputs.

Preferably, authorization control circuit 49 makes swapping circuits 74a-c pass test data along the scan chains in parallel when testing is authorized. However, this is not necessary. In an alternative embodiment authorization control circuit 49 makes swapping circuits 74a-c swap the connections between the scan chains in a predetermined time varying manner also when testing is authorized.

In effect, this means that the external terminals that are used as inputs and outputs of a scan chain change as a function of time during shifting. When this form of swapping is used when test data is shifted in, test data for testing from a specific scan chain will have to be applied to the integrated circuit in stretches of bits that are applied to the external terminals of different scan chains. Similarly when this form of swapping is used when test data is shifted out, test results from a specific scan chain will have to be gathered in stretches of bits that are collected from the external terminals of different scan chains. This makes it even more difficult to identify the scan chains.

The predetermined time varying manner of swapping the connections between the scan chains may be started for example in response to a reset signal, or in response to detection that a predetermined key has been supplied, after which a periodically repeated pattern of swapping is started. Thus, external test equipment can be synchronized to the predetermined time varying manner of swapping.

It may be noted that several scan chains can be used in parallel for shift in and shift out during testing. In this case the test data for different scan chains must be mixed together and test results for different scan chains must be collected.

Preferably, the authorization circuit is arranged to cause swapping both during shift in of test data and during shift out of test results. But alternatively, swapping may be enabled during shift in or shift out only. This still makes it difficult to identify the scan chains.

In its simplest form, swapping may be realized only by a swapping circuit between the output of a scan chain and the external terminals of the integrated circuit. Thus, a time varying connection of the output of the scan chain to different external terminals can be realized, making it more difficult to identify which external terminal should be used. However, use of "internal" swapping circuits between different parts of the scan chains has the additional advantage that the control over the functional circuits is harder to identify and that the relevant external terminals are even harder to identify.

Of course, swapping may be combined with the addition of loops, bypasses and logic gates to the scan chain. Use of some form of time dependently active logic gates and/or an LFSR structure is particularly advantageous since it will perturb any test pattern that may be applied to probe for the scan chains. Although two input two output swapping circuits have been shown, alternatively n-input n-output swapping circuits (e.g. cross-bar switches), with "n" an integer greater than two may be used, so that different swaps can be realized at different times, or more complicated permutations of the connections than swapping can be realized, making it to even more difficult to identify the scan chains. Although the figure suggests placing swapping circuits at corresponding positions in the different scan chains (inputs connected to the mth scan flip-flop of both chains) this is not necessary.

Swapping may also be combined with the authorization control circuit of FIG. 6, so that bits are swapped between the second shift register and one or more scan chains.

It should be noted that in addition to the disclosed modifications to the scan chain another security mechanism can be used to prevent secret information to be loaded into any scan chain and/or shifted through that scan chain unless authorization is provided. Thus, the proposed measures serve to make it difficult to determine the connections to the scan chain(s) unless authorizing information is available. Alternatively, the disclosed modifications may be used by themselves to prevent access to and/or identification of the secret information. In this case no separate security mechanism is provided to prevent secret information to be loaded or shifted.

The disclosed modifications to the scan chain may be used to make it more difficult to decide whether an appropriate key has been provided or whether the appropriate fuses and/or anti-fuses have been restored. Conversely the presence of the appropriate combination of fuses and/or anti-fuses may be used to disable the modifications to the scan chain, or to set them to a predetermined configuration that allows systematic access to test data.

The invention claimed is:

1. A method of testing an integrated circuit that comprises a functional circuit, a test access circuit coupled to the functional circuit, and a plurality of fuse elements coupled to the test access circuit, the fuse elements being connected in a circuit configuration that makes the functional circuit consistently accessible via the test access circuit only when first fuse elements of the plurality are in a blown state and second fuse elements of the plurality are in a not-blown state, the method comprising:
    obtaining the integrated circuit with all of the first and second fuse elements in the non-blown state;
    selectively blowing all of the first fuse elements and leaving all of the second fuse elements non-blown;
    subsequently performing a test using the test access circuit; and
    subsequently blowing at least part of the second fuse elements.

2. The method according to claim 1, wherein the integrated circuit comprises a further functional circuit coupled to the test access circuit, the fuse elements being connected in a circuit configuration that makes the further functional circuit consistently accessible via the test access circuit when the first fuse elements are in a blown state provided that from the second fuse elements only fuse elements of a predetermined subset of one or more the second fuse elements are in a blown state, the method comprising the steps of:
    blowing the subset of the second fuse elements after said performing step; subsequently
    performing a further test using the test access circuit; and subsequently
    blowing at least part of the second fuse elements that do not belong to said subset.

3. An integrated circuit comprising:
    a functional circuit,
    a test access circuit coupled to the functional circuit, and
    a plurality of fuse elements coupled to the test access circuit, the fuse elements being connected in a circuit configuration that makes the functional circuit consistently accessible via the test access circuit only when first fuse elements of the plurality are in a blown state and second fuse elements of the plurality are in a not-blown state.

4. The integrated circuit according to claim 3, further comprising a further functional circuit coupled to the test access circuit, the plurality of fuse elements being connected in a circuit configuration that makes the further functional circuit consistently accessible via the test access circuit when the first fuse elements are in a blown state provided that from the second fuse elements only fuse elements of a predetermined subset of one or more the second fuse elements are in a blown state.

5. The integrated circuit according to claim 3, further comprising a scan chain and a plurality of data modifying circuits coupled to the scan chain at mutually different positions along the scan chain, the first and second fuse elements being coupled to respective ones of the data modifying circuits.

6. The integrated circuit according to claim 3, further comprising a logic circuit with inputs coupled to respective ones of the first and second fuse elements and an output coupled to the test access circuit to enable consistent accessibility, the logic circuit being arranged to generate a first output signal only when the first fuse elements of the plurality are in a blown state and the second fuse elements of the plurality are in a not-blown state.

7. The integrated circuit according to claim 3, further comprising external terminals, wherein the test access circuit comprises a scan chain coupled to the functional circuit and between the external terminals, the scan chain comprising a scan cell, the integrated circuit further comprising a scan chain modifying circuit coupled to the scan chain and the fuse elements, the scan chain modifying circuit being arranged to effect differences between numbers of times that respective temporally successive parts of test data traverse the scan cell on their journey through the scan chain during shifting in a direction between the external terminals, in response to signals that effect shifting of the test data through the scan chain, conditionally when not all the first fuse elements are in a blown state or not all the first fuse elements are in a non-blown state.

8. The integrated circuit according to claim 7, wherein the scan chain modifying circuit comprises:
- a multiplexing circuit with an output coupled to an input of the scan cell, a control input and signal inputs coupled to a first further scan cell that precedes the scan cell in the scan chain and an output of the scan cell or of a second further scan cell that follows the scan cell in the scan chain; and
- a time dependent signal generator circuit having an output coupled to the control input of the multiplexing circuit.

9. The integrated circuit according to claim 7, wherein the scan chain modifying circuit comprises:
- a multiplexing circuit with a control input, a signal output coupled to a first further scan cell that follows the scan cell in the scan chain and signal inputs coupled to an output of the scan cell and an output of a second further scan cell that precedes the scan cell in the scan chain; and
- a time dependent signal generator circuit having an output coupled to the control input of the multiplexing circuit.

10. The integrated circuit according to claim 7, wherein the scan chain modifying circuit comprises:
- a switching circuit with an input coupled to an output of the scan cell, a control input and a plurality of outputs each coupled to a respective one of the external terminals, directly or via one or more respective scan cells, the switching circuit being arranged to forward the test data selectively to a selected one of the outputs, which is selected by a control signal from the control input; and
- a time dependent signal generator circuit having an output coupled to the control input of the switching circuit.

11. The integrated circuit according to claim 10, further comprising a plurality of scan chains, including the scan chain, each scan chain having an input and output coupled between a respective pair of external terminals of the integrated circuit, wherein the switching circuit is arranged to effect a selectable permutation of connections between outputs of first parts of the scan chains to inputs of second parts of the scan chains, the permutation being selected under control of the time dependent signal generator circuit.

12. The integrated circuit according to claim 7, wherein the scan chain modifying circuit comprises:
- a routing circuit coupled to the scan cell, for controllably providing alternative routes for shifting the test data path to or from the scan cell to one or more of the external terminals;
- a time dependent signal generator circuit;
- a first shift register with an input coupled to the time dependent signal generator circuit;
- a second shift register with an input for receiving a key signal from outside the integrated circuit; and
- a comparator circuit coupled to outputs of corresponding stages of the first and second shift register and an output coupled to a control input of the routing circuit.

13. The integrated circuit according to claim 7, further comprising:
- a plurality of routing circuits coupled to respective scan cells of the scan chain for controllably providing alternative routes for shifting the test data path to or from the respective scan cell to one or more of the external terminals;
- a time dependent signal generator circuit;
- a first shift register with an input coupled to the time dependent signal generator circuit;
- a second shift register with an input for receiving a key signal from outside the integrated circuit; and
- a plurality of comparator circuits, each having inputs coupled to outputs of a respective pair of corresponding stages of the first and second shift register and an output coupled to a control input of a respective one of the routing circuits.

* * * * *